US007862683B2

(12) United States Patent
Fukiage

(10) Patent No.: US 7,862,683 B2
(45) Date of Patent: Jan. 4, 2011

(54) CHAMBER DRY CLEANING

(75) Inventor: Noriaki Fukiage, Takatsuki (JP)

(73) Assignee: Tokyo Electron Limited, Tokyo (JP)

( * ) Notice: Subject to any disclaimer, the term of this patent is extended or adjusted under 35 U.S.C. 154(b) by 1225 days.

(21) Appl. No.: 11/292,293

(22) Filed: Dec. 2, 2005

(65) Prior Publication Data

US 2007/0128876 A1 Jun. 7, 2007

(51) Int. Cl.
*C23C 16/00* (2006.01)
*C23F 1/00* (2006.01)
*H01L 21/306* (2006.01)

(52) U.S. Cl. ........... 156/345.35; 118/715; 118/732 ME; 118/723 ER; 118/723 IR; 156/345.33; 156/345.34

(58) Field of Classification Search ................. 118/715, 118/723 ME, 723 IR, 723 ER; 156/345.35; 438/727, 730
See application file for complete search history.

(56) References Cited

U.S. PATENT DOCUMENTS

| | | | |
|---|---|---|---|
| 5,366,585 A | 11/1994 | Robertson et al. | |
| 6,239,553 B1 * | 5/2001 | Barnes et al. | 315/111.51 |
| 6,444,137 B1 | 9/2002 | Collins et al. | |
| 6,926,926 B2 * | 8/2005 | Cho et al. | 427/249.15 |
| 2001/0006070 A1 * | 7/2001 | Shang et al. | 134/1 |
| 2003/0079757 A1 * | 5/2003 | Shibata et al. | 134/1.1 |
| 2003/0155079 A1 * | 8/2003 | Bailey et al. | 156/345.49 |
| 2004/0163761 A1 * | 8/2004 | Strang | 156/345.33 |
| 2004/0173157 A1 * | 9/2004 | Han et al. | 118/715 |
| 2005/0224458 A1 | 10/2005 | Gaudet et al. | |
| 2006/0112876 A1 * | 6/2006 | Choi et al. | 118/715 |
| 2006/0213436 A1 * | 9/2006 | Ohmi et al. | 118/715 |

FOREIGN PATENT DOCUMENTS

| | | |
|---|---|---|
| JP | 2001131751 | 5/2001 |
| JP | 2004-335790 | * 11/2004 |

OTHER PUBLICATIONS

English language Abstract for JP 2001-131751.
Machine translation for JP 2001-131751.
International Preliminary Report on Patentability issued on Jun. 3, 2008, in PCT/US2006/040358.

* cited by examiner

*Primary Examiner*—Parviz Hassanzadeh
*Assistant Examiner*—Rakesh Dhingra

(57) ABSTRACT

An apparatus and method for improving the chamber dry cleaning of a PECVD system. The apparatus includes an annular gas ring with multiple outlets for introducing a cleaning gas into the process chamber, and the method includes using the gas ring to introduce a cleaning species from a remote plasma source into the processing chamber.

36 Claims, 11 Drawing Sheets

CHAMBER DRY CLEANING

CROSS-REFERENCE TO RELATED APPLICATIONS

This application is related to co-pending U.S. patent application Ser. No. 10/644,958, entitled "Method and Apparatus For Depositing Materials With Tunable Optical Properties And Etching Characteristics", filed on Aug. 21, 2003; co-pending U.S. patent application Ser. No. 10/702,048, entitled "Method for Depositing Materials on a Substrate", filed on Nov. 6, 2003; and co-pending U.S. patent application Ser. No. 10/702,049, entitled "Method of Improving Post-Develop Photoresist Profile on a Deposited Dielectric Film", filed on Nov. 6, 2003. The entire contents of these applications are herein incorporated by reference in their entirety.

FIELD OF THE INVENTION

The invention relates to using a plasma-enhanced chemical vapor deposition (PECVD) system to deposit thin-film, and more particularly to a method for chamber dry cleaning.

BACKGROUND OF THE INVENTION

Integrated circuit and device fabrication requires deposition of electronic materials on substrates. Material deposition is often accomplished by plasma-enhanced chemical vapor deposition (PECVD), wherein a substrate (wafer) is placed in a reaction chamber and exposed to an ambient of reactive gases. The gases react on the wafer surface to form the film. The deposited film may be a permanent part of the substrate or finished circuit. In this case, the film characteristics are chosen to provide the electrical, physical, or chemical properties required for circuit operation. In other cases, the film may be employed as a temporary layer that enables or simplifies device or circuit fabrication.

SUMMARY OF THE INVENTION

One embodiment of the invention relates to a PECVD system, more particularly, a chamber dry cleaning process. More specifically, the embodiment relates to uniformity improvement and cleaning rate improvement of the dry cleaning process by the introduction of cleaning species from a remote plasma source.

In another embodiment, remote plasma species are provided to the process chamber, where the remote plasma species are created using a remote plasma source coupled to the process chamber. The remote plasma species are introduced into the processing chamber from an annular ring attached on the chamber wall, the annular ring comprising multiple outlets to flow remote plasma species towards the processing space. The process chamber is cleaned using the remote plasma species.

DETAILED DESCRIPTION OF AN EMBODIMENT

Figure 1:
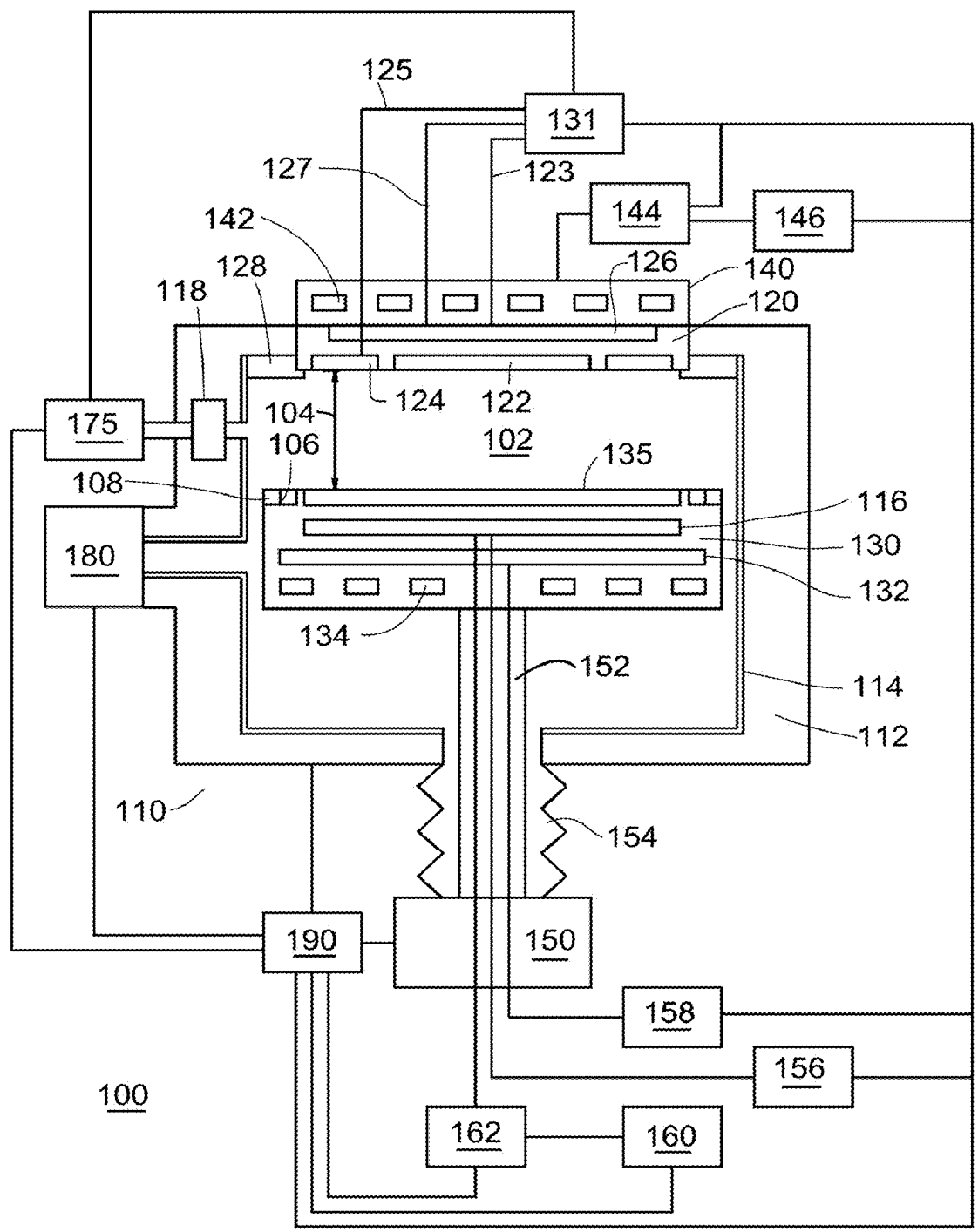
FIG. 1 illustrates a simplified block diagram for a PECVD system in accordance with an embodiment of the invention.

FIG. 1 illustrates a simplified block diagram for a PECVD system in accordance with an embodiment of the invention. In the illustrated embodiment, PECVD system 100 comprises processing chamber 110, upper electrode 140 as part of a capacitively coupled plasma source, showerhead assembly 120, substrate holder 130 for supporting substrate 135, pressure control system 180, and controller 190.

In one embodiment, PECVD system 100 can comprise a remote plasma system 175 that can be coupled to the processing chamber 110 using a gas ring 118. Gas ring 118 encircles processing chamber 110 and connects to processing chamber 110 at at least a plurality of points around the circumference of processing chamber 110. Of course, gas ring 118 can connect to processing chamber 110 continuously around the periphery of processing chamber 110. The remote plasma system 175 can be used for chamber cleaning. Suitable remote and/or upstream plasma sources include Radio Frequency (RF) plasma, inductively coupled plasma, plasma torch, capacitively coupled plasma, microwave plasma, capacitive microwave plasma, microwave induced plasma, slot plane antenna plasma, microwave slot plane antenna plasma, UV lamps, surface wave plasma, or helicon wave plasma, or combinations thereof, or the like. One or more than one source may be used. Examples of commercial remote plasma sources include the ASTRON® sources commercially available from MKS Instruments, Inc., ASTeX® Products (90 Industrial Way, Wilmington, Mass. 01887), and TRIAS™ SPA processing systems commercially available from Tokyo Electron Limited, Akasaka, Japan.

In one embodiment, PECVD system 100 can comprise a pressure control system 180 that can be coupled to the processing chamber 110. For example, the pressure control system 180 can comprise a throttle valve (not shown) and a turbomolecular pump (TMP) (not shown) and can provide a controlled pressure in processing chamber 110. In alternate embodiments, the pressure control system can comprise a dry pump. For example, the chamber pressure can range from approximately 0.1 mTorr to approximately 100 Torr. The chamber pressure can range from approximately 0.1 Torr to approximately 20 Torr.

Processing chamber 110 can facilitate the formation of plasma in process space 102. PECVD system 100 can be configured to process substrates of any size, such as 200 mm substrates, 300 mm substrates, or larger substrates. The PECVD system 100 can operate by generating plasma in one or more processing chambers.

PECVD system 100 comprises a showerhead assembly 120 coupled to the processing chamber 110. Showerhead assembly is mounted opposite the substrate holder 130. Showerhead assembly 120 comprises a center region 122, an edge region 124, and a sub region 126. Shield ring 128 can be used to couple showerhead assembly 120 to processing chamber 110.

Center region 122 is coupled to gas supply system 131 by a first process gas line 123. Edge region 124 is coupled to gas supply system 131 by a second process gas line 125. Sub region 126 is coupled to gas supply system 131 by a third process gas line 127.

Gas supply system 131 provides a first process gas to the center region 122, a second process gas to the edge region 124, and a third process gas to the sub region 126. The gas chemistries and flow rates can be individually controlled to these regions. Alternately, the center region and the edge region can be coupled together as a single primary region, and gas supply system can provide the first process gas and/or the second process gas to the primary region. In alternate embodiments, any of the regions can be coupled together and the gas supply system can provide one or more process gasses as appropriate.

The gas supply system 131 can comprise at least one vaporizer (not shown) for providing liquid precursors. Alternately, a vaporizer is not required. In an alternate embodiment, a bubbling system can be used.

PECVD system 100 comprises an upper electrode 140 that can be coupled to showerhead assembly 120 and coupled to the processing chamber 110. Upper electrode 140 can comprise temperature control elements 142. Upper electrode 140 can be coupled to a first RF source 146 using a first match network 144. Alternately, a match network is not required.

The first RF source 146 provides a Top Radio Frequency (TRF) signal to the upper electrode, and the first RF source 146 can operate in a frequency range from approximately 0.1 MHz. to approximately 200 MHz. The TRF signal can be in the frequency range from approximately 1 MHz. to approximately 100 MHz, or alternatively in the frequency range from approximately 2 MHz. to approximately 60 MHz. The first RF source can operate in a power range from approximately 0 watts to approximately 10000 watts, or alternatively the first RF source operates in a power range from approximately 0.1 watts to approximately 5000 watts. The power can be less than approximately 10 watt/cm$^2$.

Upper electrode 140 and RF source 146 are parts of a capacitively coupled plasma source. The capacitively couple plasma source may be replaced with or augmented by other types of plasma sources, such as an inductively coupled plasma (ICP) source, a transformer-coupled plasma (TCP) source, a microwave powered plasma source, an electron cyclotron resonance (ECR) plasma source, a Helicon wave plasma source, or a surface wave plasma source. As is well known in the art, upper electrode 140 may be eliminated or reconfigured in the various suitable plasma sources.

Substrate 135 can be, for example, transferred into and out of processing chamber 110 through a slot valve (not shown) or a chamber feed-through (not shown) via robotic substrate transfer system (not shown).

Substrate 135 can be affixed to the substrate holder 130 via an electrostatic clamping system. For example, an electrostatic clamping system can comprise an electrode 116 and an ESC supply 156. Clamping voltages, that can range from approximately −2000 V to approximately +2000 V, for example, can be provided to the clamping electrode. Alternatively, the clamping voltage can range from approximately −1000 V to approximately +1000 V. In alternate embodiments, an ESC system and supply is not required.

Substrate holder 130 can comprise lift pins (not shown) for lowering and/or raising a substrate to and/or from the surface of the substrate holder. In alternate embodiments, different lifting means can be provided in substrate holder 130. In alternate embodiments, gas can, for example, be delivered to the backside of substrate 135 via a backside gas system to improve the gas-gap thermal conductance between substrate 135 and substrate holder 130.

A temperature control system can also be provided. Such a system can be utilized when temperature control of the substrate is required at elevated or reduced temperatures. For example, a heating element 132, such as resistive heating elements, or thermoelectric heaters/coolers can be included, and substrate holder 130 can further include a heat exchange system 134. Heating element 132 can be coupled to heater supply 158. Heat exchange system 134 can include a re-circulating coolant flow means that receives heat from substrate holder 130 and transfers heat to a heat exchanger system (not shown), or when heating, transfers heat from the heat exchanger system.

Also, electrode 116 can be coupled to a second RF source 160 using a second match network 162. Alternatively, a match network is not required.

The second RF source 160 provides a Bottom Radio Frequency signal (BRF) to the lower electrode 116, and the second RF source 160 can operate in a frequency range from approximately 0.1 MHz. to approximately 200 MHz. The BRF signal can be in the frequency range from approximately 0.2 MHz. to approximately 30 MHz, or alternatively, in the frequency range from approximately 0.3 MHz. to approximately 15 MHz. The second RF source can operate in a power range from approximately 0 watts to approximately 1000 watts, or alternatively, the second RF source can operate in a power range from approximately 0 watts to approximately 500 watts. In various embodiments, the lower electrode 116 may not be used, or may be the sole source of plasma within the chamber, or may augment any additional plasma source.

PECVD system 100 can further comprise a translation device 150 that can be coupled by a bellows 154 to the processing chamber 110. Also, coupling assembly 152 can couple translation device 150 to the substrate holder 130. Bellows 154 is configured to seal the vertical translation device from the atmosphere outside the processing chamber 110.

Translation device 150 allows a variable gap 104 to be established between the showerhead assembly 120 and the substrate 135. The gap can range from approximately 1 mm to approximately 200 mm, and alternatively, the gap can range from approximately 2 mm to approximately 80 mm. The gap can remain fixed or the gap can be changed during any processes in the chamber.

Additionally, substrate holder 130 can further comprise a focus ring 106 and ceramic cover 108. Alternately, a focus ring 106 and/or ceramic cover 108 are not required.

At least one chamber wall 112 can comprise a coating 114 to protect the wall. For example, the coating 114 can comprise a ceramic material. In an alternate embodiment, a coating is not required. Furthermore, a ceramic shield (not shown) can be used within processing chamber 110. In addition, the temperature control system can be used to control the chamber wall temperature. For example, ports can be provided in the chamber wall for controlling temperature. Chamber wall temperature can be maintained relatively constant while a process is being performed in the chamber.

Also, the temperature control system can be used to control the temperature of the upper electrode. Temperature control elements 142 can be used to control the upper electrode temperature. Upper electrode temperature can be maintained relatively constant while a process is being performed in the chamber.

Furthermore, PECVD system 100 can also comprise a purging system (not shown) that can be used for controlling contamination.

In an alternate embodiment, processing chamber 110 can further comprise a monitoring port (not shown). A monitoring port can permit optical monitoring of process space 102.

PECVD system 100 also comprises a controller 190. Controller 190 can be coupled to chamber 110, showerhead assembly 120, substrate holder 130, gas supply system 131, upper electrode 140, first RF match 144, first RF source 146, translation device 150, ESC supply 156, heater supply 158, second RF match 162, second RF source 160, a purging system (not shown), remote plasma device 175, and pressure control system 180. The controller can be configured to provide control data to these components and receive data such as process data from these components. For example, controller 190 can comprise a microprocessor, a memory, and a digital I/O port capable of generating control voltages sufficient to communicate and activate inputs to the processing system 100 as well as monitor outputs from the PECVD system 100. Moreover, the controller 190 can exchange information with system components. Also, a program stored in the memory can be utilized to control the aforementioned components of a PECVD system 100 according to a process recipe. In addition, controller 190 can be configured to analyze the process data, to compare the process data with target process data, and to use the comparison to change a process and/or control the PECVD system. Also, the controller can be configured to analyze the process data, to compare the process data with historical process data, and to use the comparison to predict, prevent, and/or declare a fault.

Figure 2A:
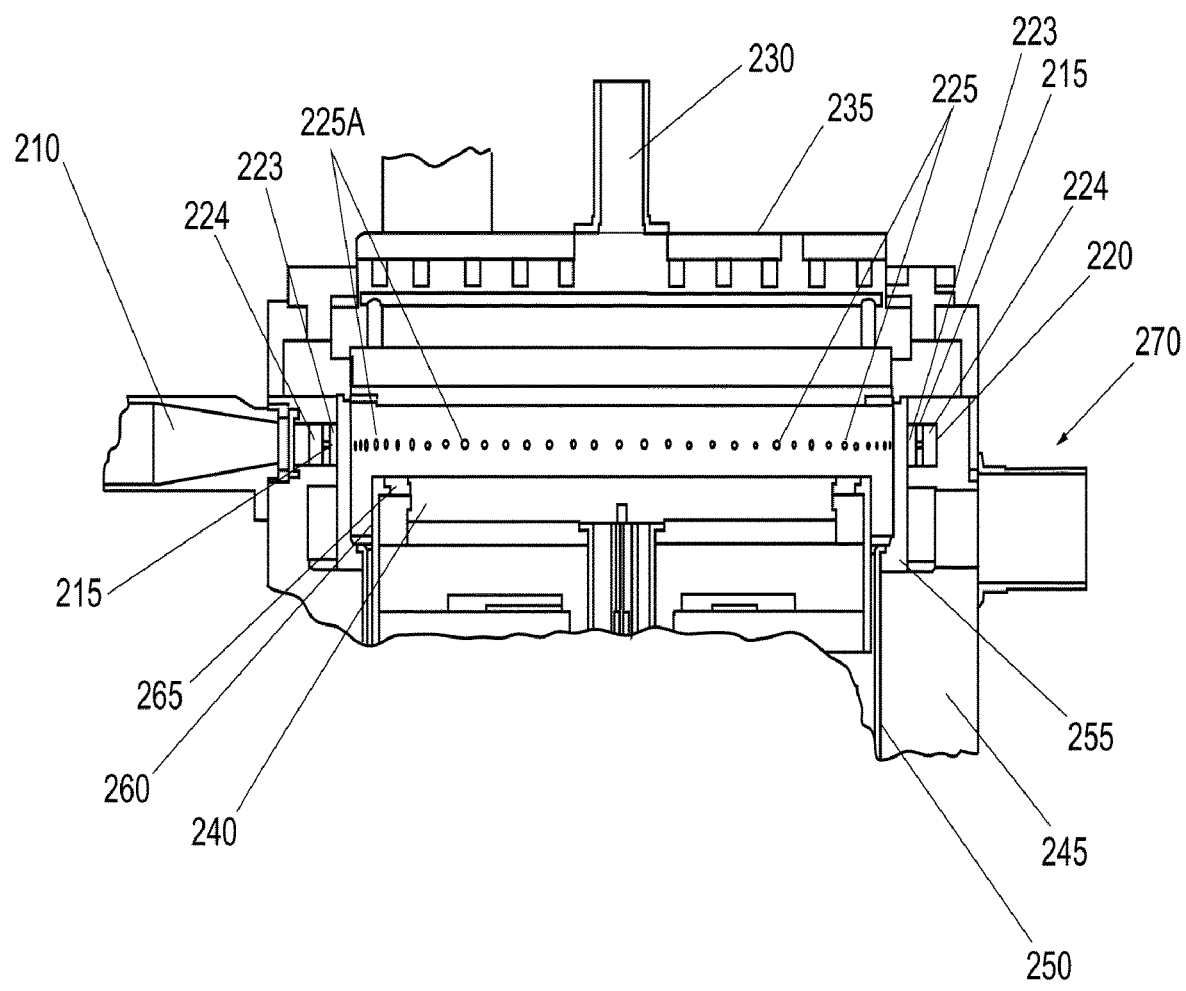
FIGS. 2A and 2B show another simplified block diagram for a PECVD system in accordance with an embodiment of the invention.
Figure 2B:
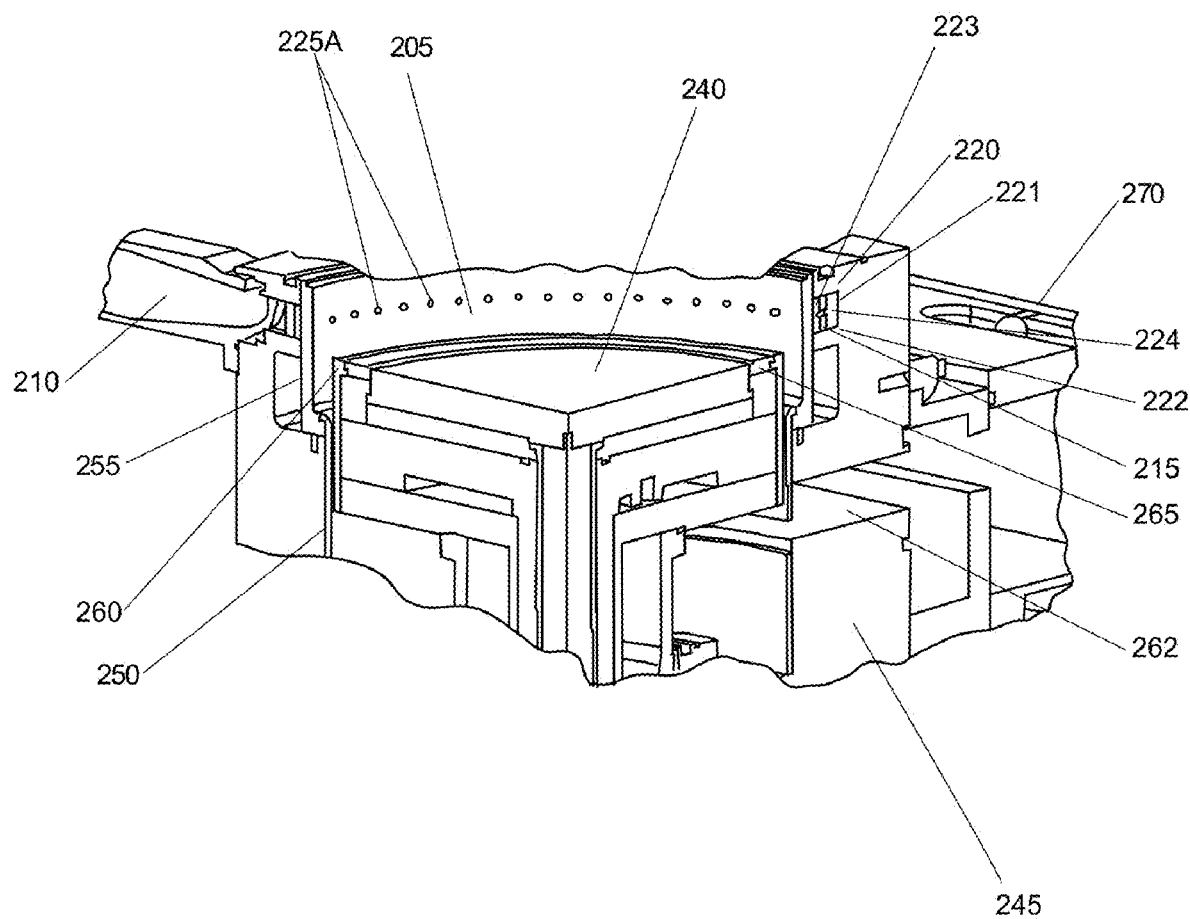
Figure 3:
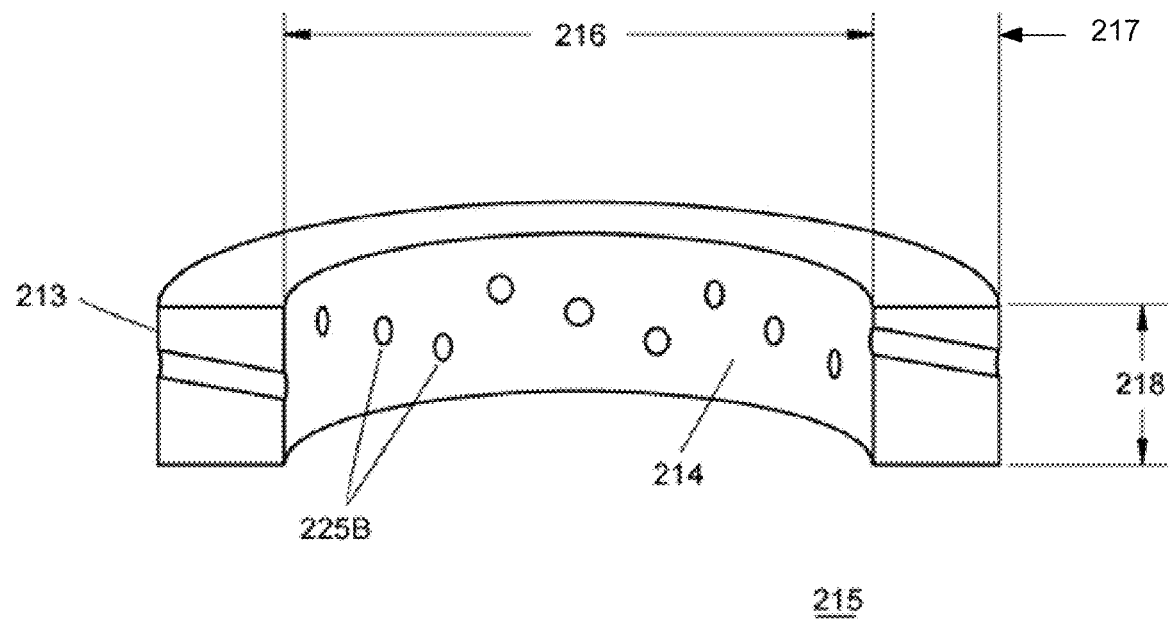
FIG. 3 shows a simplified schematic view of a baffle plate in accordance with an embodiment of the invention.

FIGS. 2A and 2B show simplified pictorial representations of a processing chamber in accordance with an embodiment of the invention. In the illustrated embodiments, a simplified two-dimensional view and a simplified three-dimensional view of a processing module 200 are shown. In alternate embodiments, different chamber configurations may be used. FIG. 3 shows a simplified schematic view of a baffle plate in accordance with an embodiment of the invention.

In the illustrated embodiments, a remote plasma input line 210 is shown. The remote plasma input line 210 can be coupled to a remote plasma generator (175, FIG. 1). The remote plasma generator can create a remote plasma species and the remote plasma species can flow through the remote plasma input line 210 from the remote plasma generator to a remote plasma supply space 220 in the processing module 200. A baffle plate 215 (FIG. 3) can be inserted in the remote plasma supply space 220 and divide the space into radially inward region 223 and radially inward region 224 to improve the uniformity of flow of remote plasma (cleaning) species. The baffle plate can have a diameter 216, a depth 217, and a height 218. Further, the baffle plate can include an inner surface 214 and an outer surface 213.

In one embodiment, the remote plasma supply space 220 is configured as an annular ring around the processing space 205. The remote plasma supply space 220 can be created by machining an annular groove in the upper portion of the inner wall of the processing chamber 245. Alternately, other methods such as casting may be used to create an annular groove. Plasma species flow from input line 210 to region 224, and through holes 225B in baffle 215 to region 223.

The remote plasma supply space 220 can have a height 221 and a depth 222. For example, the height can vary from approximately 5 mm to approximately 50 mm, and the depth can vary from approximately 5 mm to approximately 50 mm. In alternate embodiments, the remote plasma supply space 220 may be formed using an asymmetrical annular groove.

The processing module can comprise a lower shield 250, an upper shield 255, a substrate holder shield 260, and a focus ring 265. The shields and the focus ring can be constructed using ceramic and/or metallic material. In addition, the shields and the focus ring can be coated with one or more materials to protect them during processing and/or cleaning. The thickness of upper shield 255 can range approximately from 1 mm to approximately 10 mm.

The upper shield 255 can be coupled to the upper portion of the inner wall of the processing chamber 245. The outer surface of the upper shield can be used to form the inside surface of the remote plasma supply space 220.

The upper shield 255, shown in FIG. 2A, and FIG. 2B, can comprise a number of supply holes 225A that can be used to flow the remote plasma supply species from region 223 into the processing space 205. A diameter of the holes 225A can be from approximately 0.1 mm to approximately 20 mm, and can be configured to direct the flow of the remote plasma supply species into the processing space 205 during a cleaning process. Holes 225A can be tapered to control flow direction, or flow rate, or both for the remote plasma supply species into the processing space 205.

An adjustable substrate holder 240 can be used to position a substrate (not shown) during a deposition process, a cleaning process, or a remote plasma cleaning operation. In one embodiment, a dummy wafer can coupled to the adjustable substrate holder 240 and can be positioned by the adjustable substrate holder 240 to different positions before, during, and/or after a remote plasma cleaning operation.

A transfer port 262 can be used for transferring wafers into and out of the processing space 205.

Referring to FIGS. 2A and 2B, the surface of remote plasma input line 210, the remote plasma supply space 220 and the baffle plate 215 can be coated by a material that is substantially inactive with respect to the cleaning species. For example, materials, such as teflon, $Al_2O_3$, AlF, YF, or $Y_2O_3$, or any combination of two or more, thereof can be used to improve the life time of cleaning species that is activated at the remote plasma source. In addition, one or more of the through holes 225A can angled such that the outlet stream of gas is directed toward the shower plate, and/or one or more of the through holes 225A can angled such that the outlet stream of gas is directed toward the substrate holder to improve the stream of cleaning gas for more efficiency.

Figure 4:
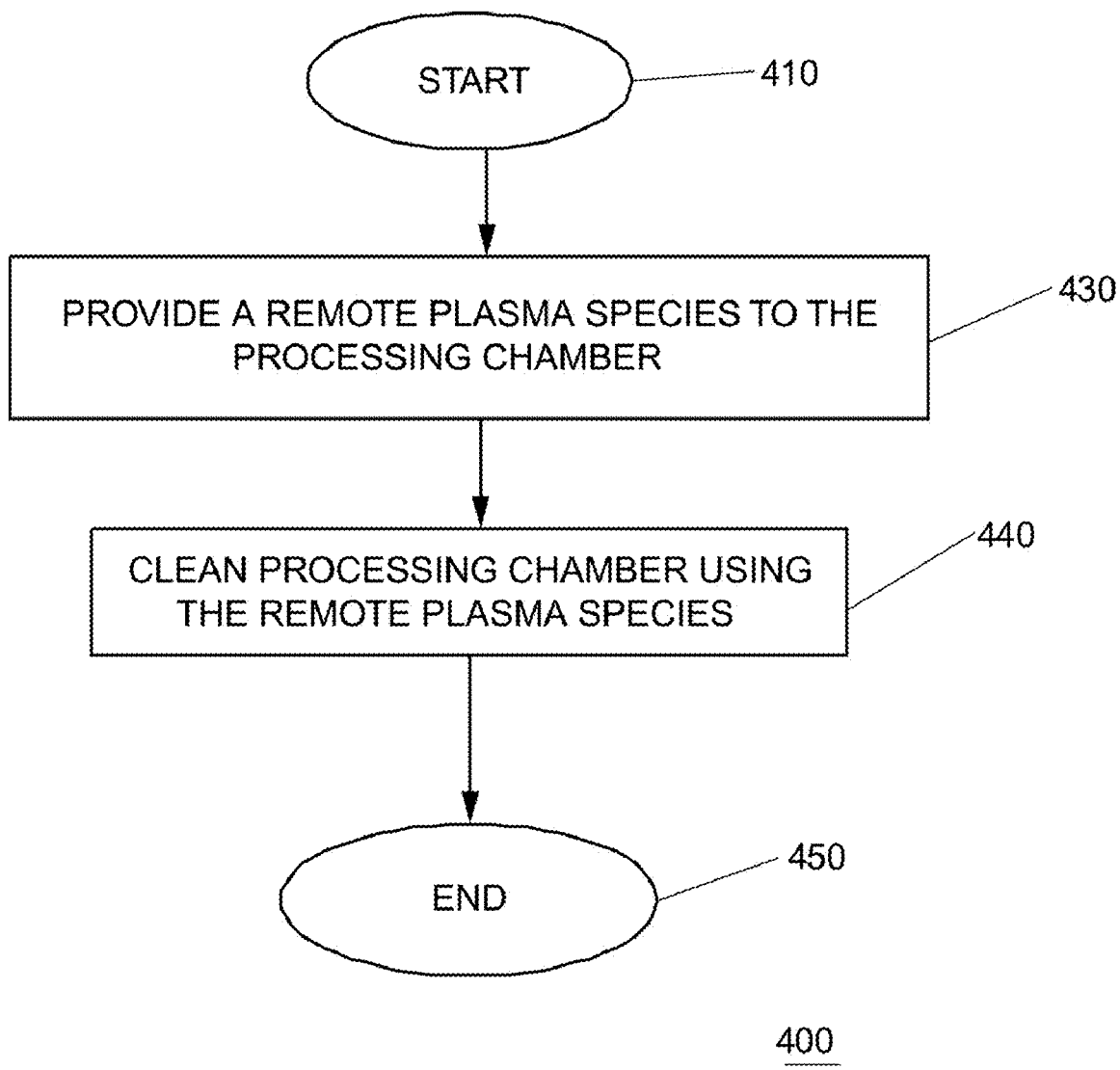
FIG. 4 shows an exemplary cleaning process in accordance with an embodiment of the invention.

FIG. 4 shows a simplified flow diagram for a method of cleaning a processing chamber in accordance with an embodiment of the invention. Procedure 400 starts in 410.

In one embodiment, a substrate is placed on a substrate holder in a processing chamber. For example, a dummy wafer can be used to protect the surface of the stage. Alternatively, a dummy wafer may not be used during a cleaning process. The substrate holder can be used to establish a gap between an upper electrode surface and a surface of the substrate holder. The gap can range from approximately 1 mm to approximately 200 mm, or alternatively, the gap can range from approximately 2 mm to approximately 80 mm. The substrate holder can be translatable. Thus, in alternate embodiments, the gap size can be changed while processing the wafer.

At 430, a plasma can be created remote from the processing chamber and provided to the interior of the processing chamber. In one embodiment, the power provided to the remote plasma generator can vary from approximately 1 W to approximately 3000 W, or alternately from approximately 1000 W to approximately 2700 W.

In one embodiment, the residuals deposited on the interior surfaces of the processing chamber can be PECVD materials, such as $SiO_2$, SiN, SiCH, SiCOH, SiCN, SiCON, SiON, a-C, or CF, and the remote plasma for cleaning these materials can comprise a fluorine-containing gas and/or oxygen-containing gas. In alternate embodiments, the residuals deposited on the interior surfaces of the processing chamber can include other materials, such as metallic and/or Ge based materials, and the remote plasma for cleaning these materials can comprise a fluorine-based, chlorine-based and/or oxygen-based cleaning chemistry. The fluorine, chlorine or oxygen-containing gas can be provided at a flow rate of approximately 0 sccm to approximately 5000 sccm. The gas from the remote plasma source can also include an inert gas, such as Ar, He, Neon, Xenon or $N_2$, or a combination of two or more thereof. Such inert gas can be provided at a flow rate of approximately 0 sccm to approximately 10000 sccm.

At 440, the processing chamber can be cleaned using the remote plasma species. During the cleaning operation, a TRF signal and a BRF signal are not required. In an alternate embodiment, a TRF signal can be provided to the upper electrode using the first RF source during at least a portion of the cleaning operation. For example, the first RF source can operate in a frequency range from approximately 0.1 MHz. to approximately 200 MHz. Alternatively, the first RF source can operate in a frequency range from approximately 1 MHz. to approximately 100 MHz, or the first RF source can operate in a frequency range from approximately 2 MHz. to approximately 60 MHz. The first RF source can operate in a power range from approximately 10 watts to approximately 10000 watts, or alternatively, the first RF source can operate in a power range from approximately 10 watts to approximately 5000 watts.

In other embodiments, during at least a portion of the cleaning operation, a BRF signal can be provided to the lower electrode in the substrate holder using the second RF source. For example, the second RF source can operate in a frequency range from approximately 0.1 MHz. to approximately 200 MHz. Alternatively, the second RF source can operate in a frequency range from approximately 0.2 MHz. to approximately 30 MHz, or the second RF source can operate in a frequency range from approximately 0.3 MHz. to approximately 15 MHz. The second RF source can operate in a power range from approximately 0 watts to approximately 1000 watts, or alternatively, the second RF source can operate in a power range from approximately 0 watts to approximately 500 watts. In an alternate embodiment, a BRF signal is not required.

In other embodiments, during a portion of the cleaning operation, a plasma species can be provided in the chamber from another source. Upper electrode 140 and RF source 146 are parts of a capacitively coupled plasma source. The capacitively coupled plasma source may be replaced with or augmented by other types of plasma sources, such as an inductively coupled plasma (ICP) source, a transformer-coupled plasma (TCP) source, a microwave powered plasma source, an electron cyclotron resonance (ECR) plasma source, a Helicon wave plasma source, and a surface wave plasma source. As is well known in the art, upper electrode 140 may be eliminated or reconfigured in the various suitable plasma sources.

During a cleaning operation, process gas from the showerhead assembly is not required. In an alternate embodiment, the showerhead assembly can be used to provide process gas into the processing chamber during at least a portion of the cleaning operation. The process gas may comprise a fluorine-containing gas, a chlorine-containing gas, oxygen-containing gas or an inert gas, or any combination of two or more thereof. The inert gas can be argon, helium, neon, xenon and/or nitrogen.

A pressure control system can be coupled to the chamber, and the chamber pressure can be controlled using the pressure control system. For example, the chamber pressure can range from approximately 0.1 mTorr to approximately 100 Torr.

A temperature control system can be coupled to the substrate holder, and the substrate temperature can be controlled using the temperature control system. For example, the substrate temperature can range from approximately 0° C. to approximately 500° C. The temperature control system can also be coupled to the chamber wall. For example, the temperature of the chamber wall can range from approximately 0° C. to approximately 500° C. In addition, the temperature control system can be coupled to the showerhead assembly. For example, the temperature of the showerhead assembly can range from approximately 0° C. to approximately 500° C.

The cleaning operation can be performed in a time from approximately 2 seconds to approximately 1800 seconds.

Procedure 400 ends in 450.

Figure 5A:
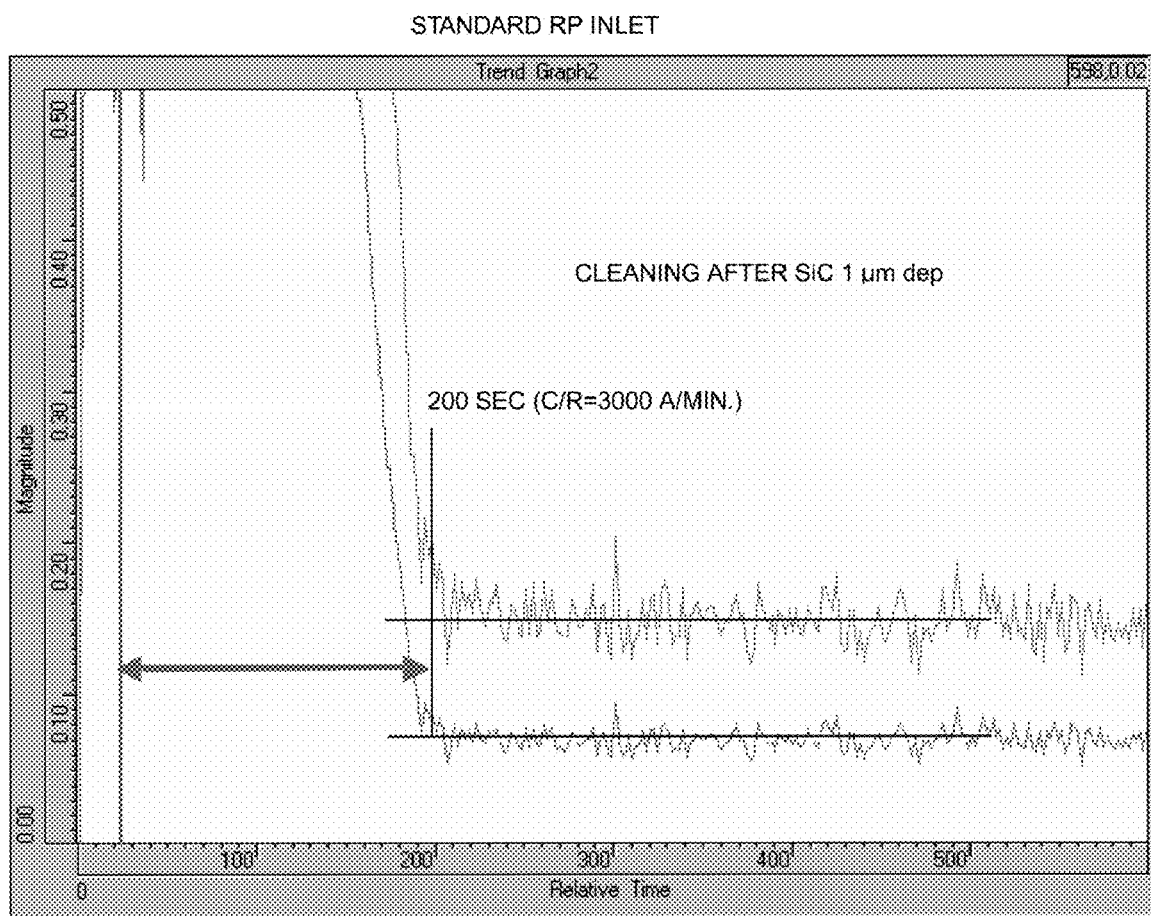
FIGS. 5A and 5B show the cleaning end point detection by OES for both a standard RP inlet and a new RP inlet.
Figure 5B:
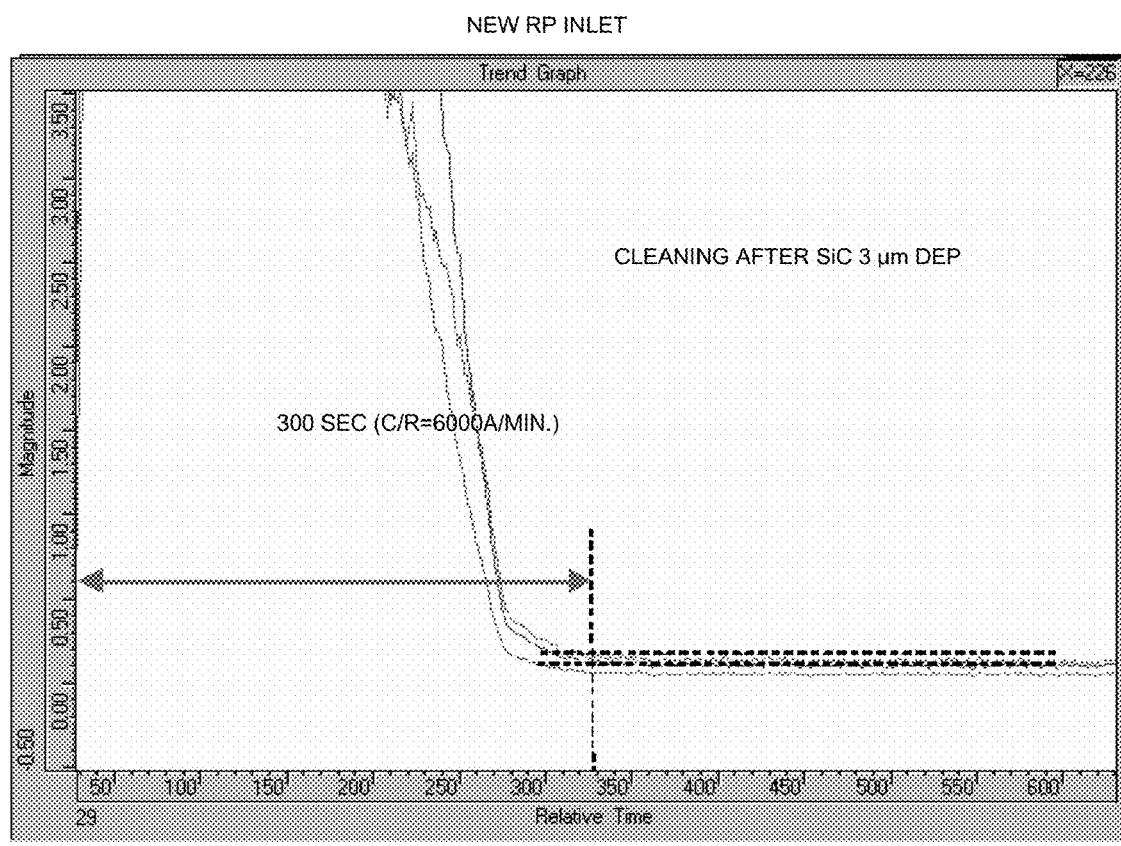

FIGS. 5A and 5B show exemplary trend graphs in accordance with embodiments of the invention. FIG. 5A is a trend graph showing the H* intensity for a cleaning operation using a standard remote plasma inlet after 1 um SIC deposition. In a standard remote plasma inlet, all plasma from the remote source enters the chamber at a single location, the horizontal arrow indicates the cleaning time of 200 seconds, so that the cleaning rate is 3000 A/min. FIG. 5B is a trend graph showing the H* intensity for a cleaning operation using the remote plasma inlet in accordance with the present invention after 3 um SiC deposition. The horizontal arrow indicates the cleaning time of 300 seconds, so that the cleaning rate is 6000 A/min. The cleaning rate is faster for the using the remote plasma inlet of the present invention.

Figure 6A:
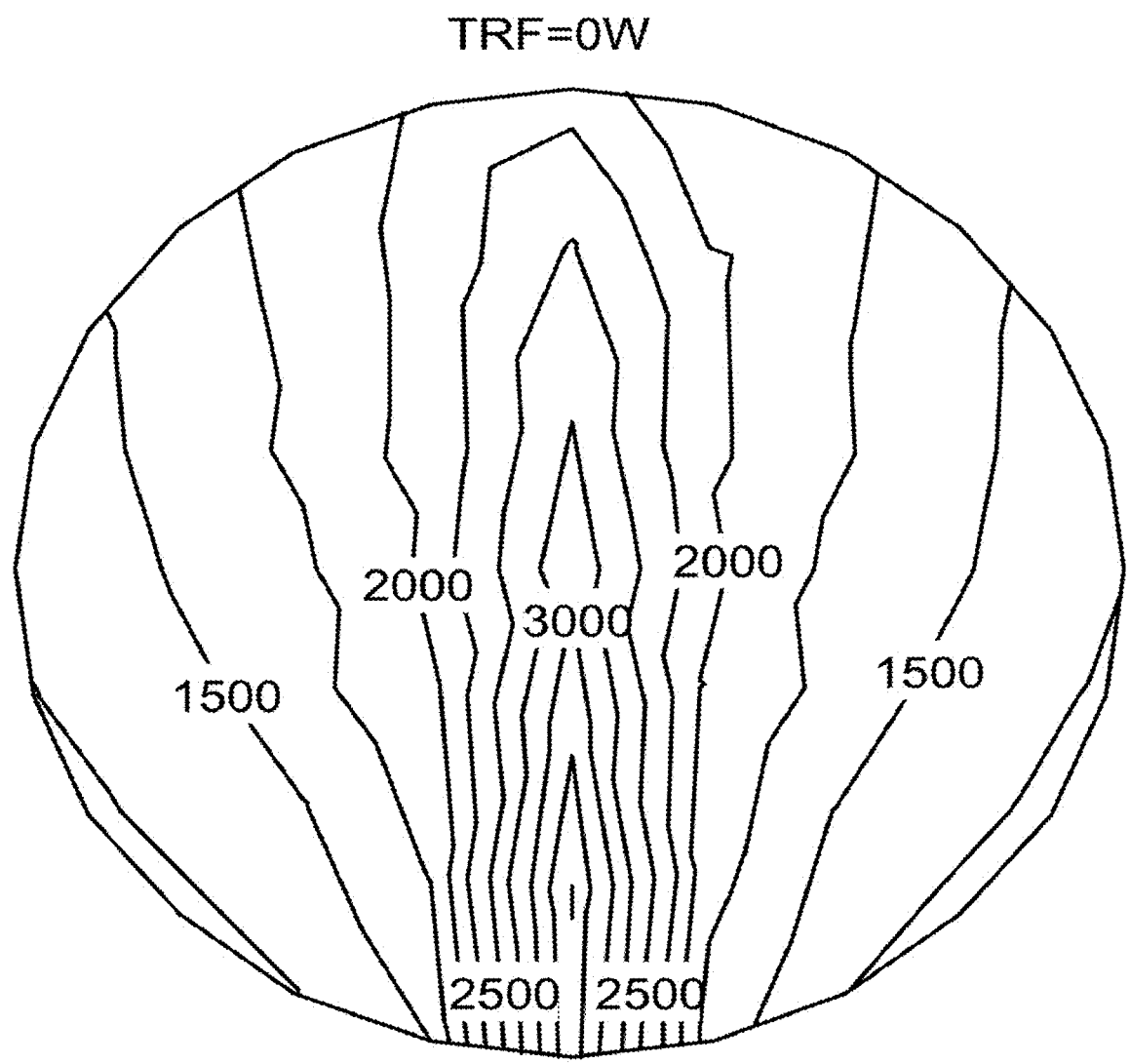
FIGS. 6A and 6B shows a $SiO_2$ etching map for a standard cleaning process with and without a Top Radio Frequency (TRF) signal.

FIGS. 6A, 6B, 7A, and 7B show exemplary results of a cleaning study performed in accordance with embodiments of the invention. In FIG. 6A, one set of results of a Remote Plasma RP+TRF cleaning study are shown.

FIG. 6A is a wafer map of an etching amount for a TEOS film deposited on a wafer using a standard RP inlet and using a TRF signal at approximately 0 watts. The delta (49 pts.) is approximately equal to 1793 A; the etch rate (E/R) is approximately equal to 5379 A/min; and the uniformity (1 Sigma) is equal to 31.66%.

Figure 6B:
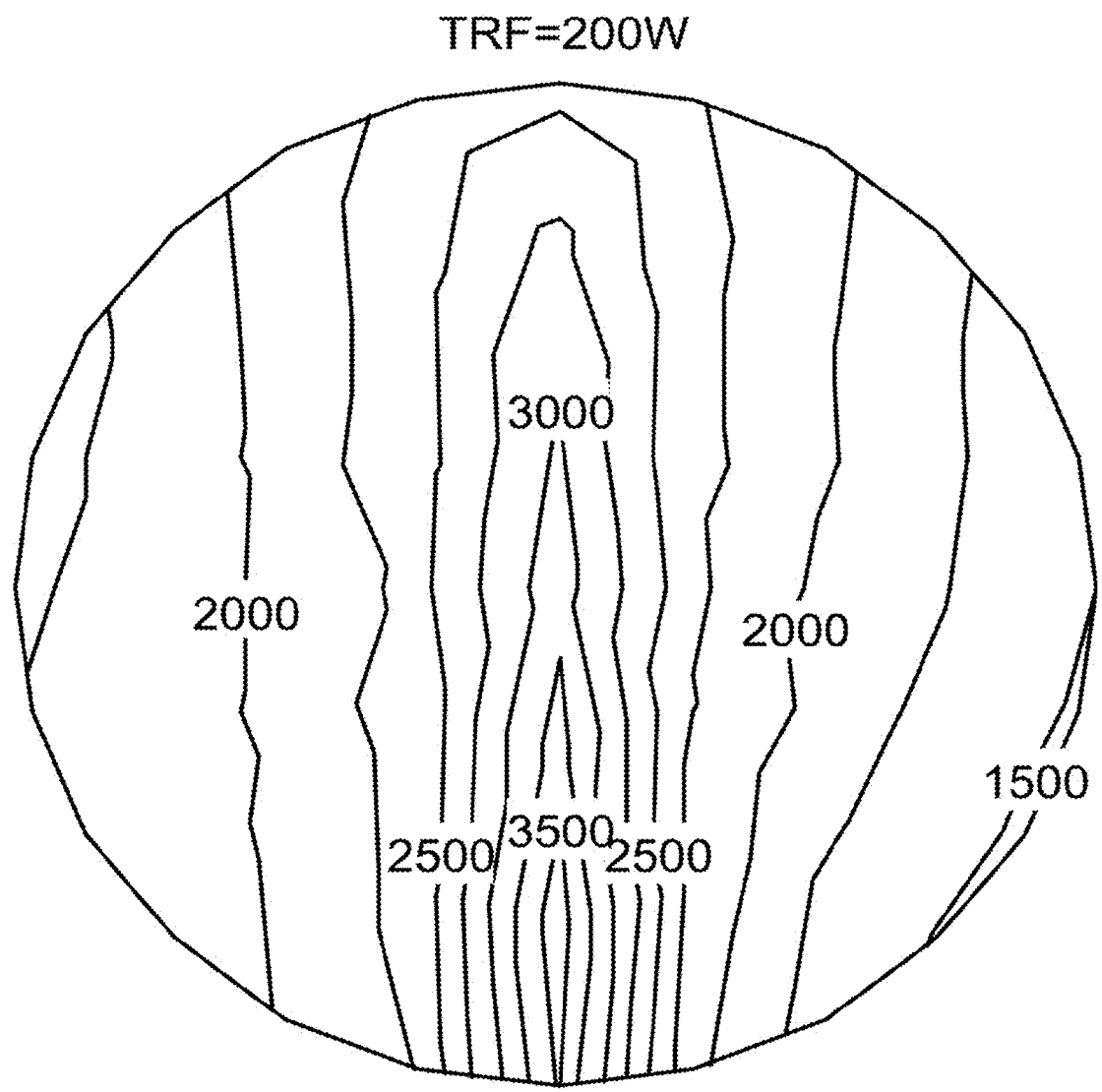

FIG. 6B is a wafer map of an etching amount for a TEOS film deposited on a wafer using a standard RP inlet and using a TRF signal at approximately 200 watts. The delta (49 pts.) is approximately equal to 2135 A; the etch rate (E/R) is approximately equal to 6475 A/min; and the uniformity (1 Sigma) is equal to 29.19%.

During the remote plasma cleaning operation, the TRF signal was provided as described above in procedure 400; the BRF signal was at approximately 0 watts; the flow rate for the $NF_3$ was approximately 300 sccm: the flow rate for $O_2$ was approximately 100 sccm; the flow rate for Ar was approximately 1500 sccm; the gap between the wafer and the upper electrode was approximately 116 mm; the chamber pressure was approximately 2 Torr; and the Electrostatic Chuck (ESC) temperature was approximately 300° C.

Figure 7A:
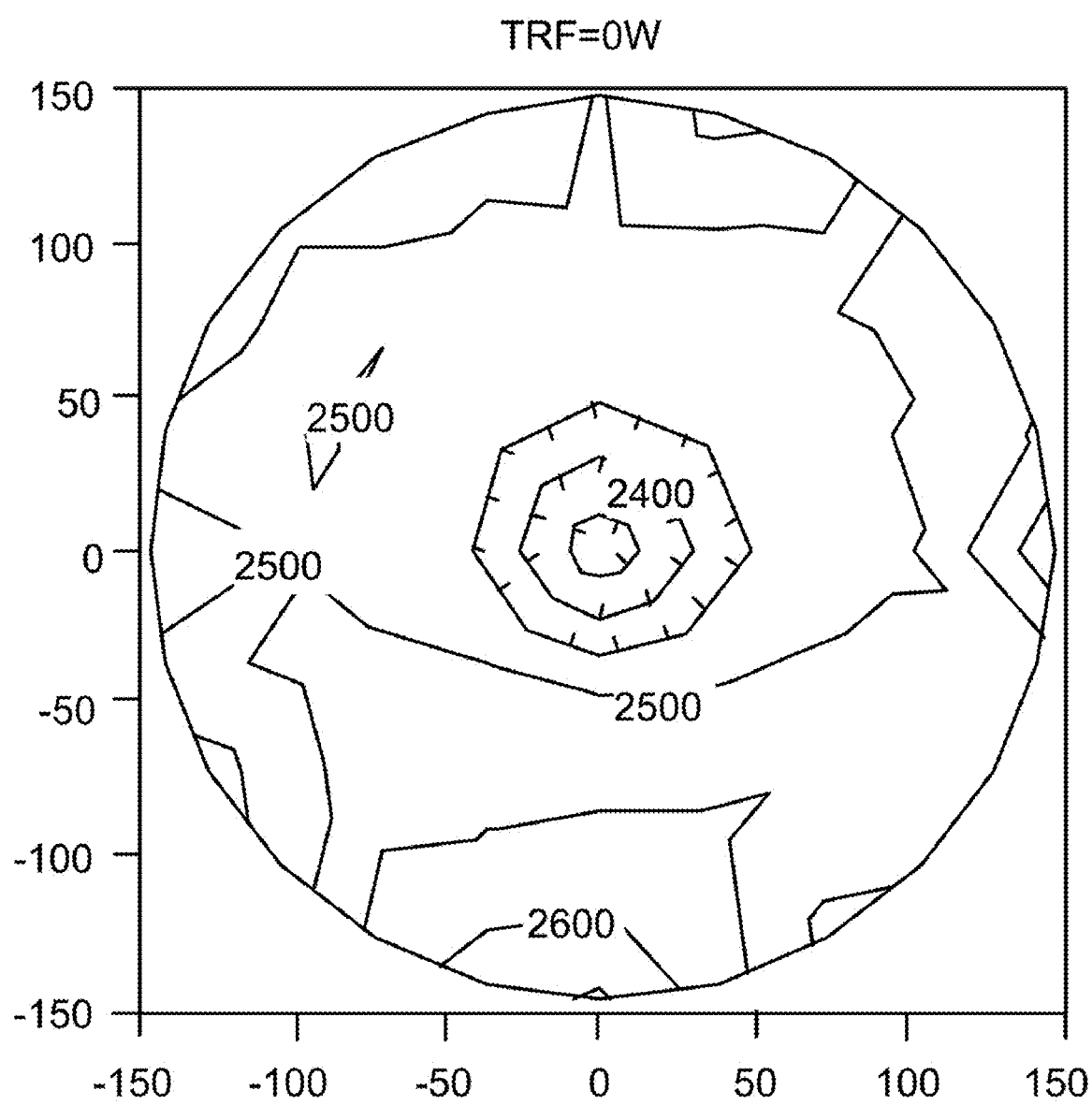
FIGS. 7A and 7B shows a $SiO_2$ etching map for a new cleaning process with and without a TRF signal.

FIG. 7A is a wafer map of an etching amount for a TEOS film deposited on a wafer using a remote plasma inlet in accordance with the present invention and using a TRF signal at approximately 0 watts. The delta (49 pts.) is approximately equal to 2495 A; the etch rate (E/R) is approximately equal to 9980 A/min; and the uniformity (1 Sigma) is equal to 2.51%.

Figure 7B:
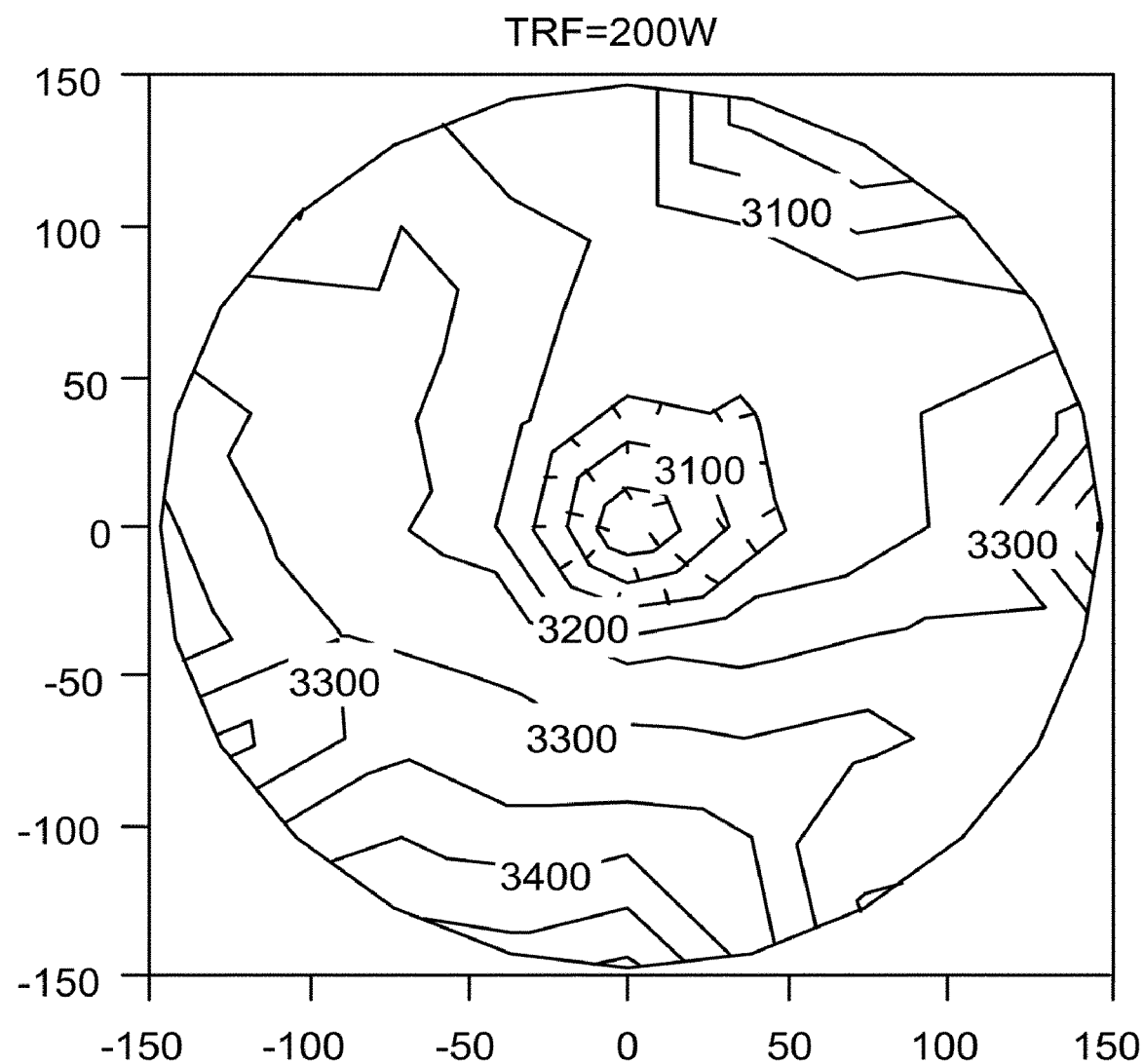

FIG. 7B is a wafer map of an etching amount for a TEOS film deposited on a wafer using a remote plasma inlet in accordance with the present invention and using a TRF signal at approximately 200 watts. The delta (49 pts.) is approximately equal to 3254 A; the etch rate (E/R) is approximately equal to 13016 A/min; and the uniformity (1 Sigma) is equal to 3.31%.

Note that with the embodiments of the present invention, the etch uniformity and the etch rate were improved over the standard RP inlet.

During the remote plasma cleaning operation, the TRF signal was applied as described above; the BRF signal was at approximately 0 watts; the flow rate for the $NF_3$ was approximately 300 sccm: the flow rate for $O_2$ was approximately 100 sccm; the flow rate for Ar was approximately 1500 sccm; the gap was approximately 116 mm; the chamber pressure was approximately 1.8 Torr; and the ESC temperature was approximately 300° C.

The chamber cleaning rate is critical for tool through-put and productivity. A tool having a higher cleaning rate can process more wafers than a tool having a lower cleaning rate. Such a tool can reduce the cost of ownership (COO).

The chamber cleaning rate can be limited by the slowest cleaning point in the chamber because such residual deposition in the processing chamber can be the source of particles which can cause defects on semiconductor devices being manufactured.

Thus, a uniform and fast chamber cleaning process is desirable for PECVD system.

Also an uneven cleaning rate can damage the processing chamber. The portion with a higher cleaning rate can be exposed to cleaning species more than the other parts. Such an exposed portion can become different from the other unexposed potions in terms of surface roughness and surface chemical state. This can effect film uniformity and can be the cause of defects. If so, such highly damaged parts must be replaced. Thus, such maintenance increases the COO of the tool.

The above example illustrates that a processing chamber can be cleaned more uniformly and in less time by using a remote plasma and an annular inlet to direct the remote plasma species into the processing chamber. During a cleaning operation, one or more cleaning processes can be performed sequentially in the chamber. During the period between the cleaning processes, the remote plasma and/or the TRF signal can be turned off. In an alternate embodiment, one or more cleaning processes can be performed sequentially in the chamber without turning off the remote plasma and/or the TRF signal. In an alternate embodiment, one or more cleaning processes can be performed using different recipes.

In one embodiment, the chamber is kept at a specific pressure during a cleaning operation. In an alternate embodiment, the chamber pressure may be changed during a cleaning operation.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A substrate processing chamber comprising:
   a chamber wall defining a substrate processing space;
   an asymmetrical annular groove disposed around the inner wall of the processing chamber, wherein a remote plasma space is configured using the asymmetrical annular groove, the asymmetrical annular groove having a height and a depth used to configure the remote plasma space;
   a baffle plate disposed in the asymmetrical annular groove, wherein the baffle plate is configured to divide the remote plasma space into an upstream region and a down stream region the baffle plate having a plurality of holes for controlling a plasma species flow;
   an upper shield disposed between the processing space and the remote plasma space, wherein the upper shield comprises a number of supply holes configured to flow the remote plasma supply species from the down stream region into the processing space; and
   a remote plasma source connected to the upstream region in the remote plasma space in the asymmetrical annular groove, the remote plasma source being configured for generating chamber cleaning species, the chamber cleaning species being introduced from the remote plasma source into the upstream region through the holes in the baffle plate to the down stream region and through the supply holes in the upper shield into the processing space to clean components of the processing chamber.

2. A substrate processing chamber of claim 1, wherein the asymmetrical annular groove is coupled to the chamber wall.

3. The substrate processing chamber as claimed in claim 1, wherein the processing chamber includes a plasma enhanced chemical vapor deposition (PECVD) process chamber.

4. The substrate processing chamber as claimed in claim 1, wherein the processing chamber includes a chemical vapor deposition (CVD) process chamber.

5. The substrate processing chamber as claimed in claim 1, wherein the processing chamber comprises a substrate holder disposed therein which holds a substrate.

6. The substrate processing chamber as claimed in claim 1, wherein the remote plasma source generates the chamber cleaning species using a fluorine-containing gas.

7. The substrate processing chamber as claimed in claim 6, wherein the fluorine-containing gas flows at a rate ranging from approximately 0 sccm to approximately 5000 sccm.

8. The substrate processing chamber as claimed in claim 6, wherein the fluorine-containing gas also includes an inert gas.

9. The substrate processing chamber as claimed in claim 8, wherein the inert gas flows at a rate ranging from approximately 0 sccm to approximately 10000 sccm.

10. The substrate processing chamber as claimed in claim 8, wherein the inert gas comprises Ar, He, Neon, Xenon or $N_2$, or a combination of two or more thereof.

11. The substrate processing chamber as claimed in claim 1, wherein the remote plasma source generates the chamber cleaning species using a chlorine-containing gas.

12. The substrate processing chamber as claimed in claim 11, wherein the chlorine-containing gas flows at a rate ranging from approximately 0 sccm to approximately 5000 sccm.

13. The substrate processing chamber as claimed in claim 12, wherein the chlorine-containing gas also includes an inert gas.

14. The substrate processing chamber as claimed in claim 13, wherein the inert gas flows at a rate ranging from approximately 0 sccm to approximately 10000 sccm.

15. The substrate processing chamber as claimed in claim 13, wherein the inert gas comprises Ar, He, Neon, Xenon, or $N_2$, or a combination of two or more thereof.

16. The substrate processing chamber as claimed in claim 1, wherein the remote plasma source generates the chamber cleaning species using an oxygen-containing gas.

17. The substrate processing chamber as claimed in claim 16, wherein the oxygen-containing gas flows at a rate ranging from approximately 0 sccm to approximately 5000 sccm.

18. The substrate processing chamber as claimed in claim 16, wherein the oxygen-containing gas also includes an inert gas.

19. The substrate processing chamber as claimed in claim 18, wherein the inert gas flows at a rate ranging from approximately 0 sccm to approximately 10000 sccm.

20. The substrate processing chamber as claimed in claim 18, wherein the inert gas comprises Ar, He, Neon, Xenon or $N_2$, or a combination of two or more thereof.

21. The substrate processing chamber as claimed in claim 1, further comprising an upper electrode in the processing chamber and an RF signal source coupled to the upper electrode, wherein the RF signal is in a frequency range from approximately 0.1 MHz. to approximately 200 MHz, and the power ranges from approximately 0.1 watts to approximately 5000 watts.

22. The substrate processing chamber as claimed in claim 1, further comprising an upper electrode in the processing chamber and an RF signal source coupled to the upper electrode, wherein the RF signal is in a frequency range from approximately 0.1 MHz. to approximately 200 MHz, and the RF signal power is less than approximately 10 watt/cm$^2$.

23. The substrate processing chamber as claimed in claim 1, further comprising an inductively coupled plasma (ICP) source, a transformer-coupled plasma (TCP) source, a microwave powered plasma source, an electron cyclotron resonance (ECR) plasma source, a Helicon wave plasma source, or a surface wave plasma source, or a combination of two or more thereof, coupled to the processing chamber for cleaning the processing chamber.

24. The substrate processing chamber as claimed in claim 1, further comprising a vacuum system coupled to the processing chamber so that the cleaning occurs at a chamber pressure in a range from approximately 0.1 mTorr to approximately 100 Torr.

25. The substrate processing chamber as claimed in claim 1, further comprising a showerhead assembly and a substrate holder disposed in the process chamber, wherein a gap between the showerhead assembly and the substrate holder ranges from approximately 1 mm to approximately 200 mm during the cleaning.

26. The substrate processing chamber as claimed in claim 1, wherein the baffle plate controls a flow direction, or a flow rate, or a combination thereof for the remote plasma species into the down steam region.

27. The substrate processing chamber as claimed in claim 26, wherein a surface on the baffle plate is inactive to the remote plasma species.

28. The substrate processing chamber as claimed in claim 27, wherein the inactive surface comprises Teflon, $Al_2O_3$, AlN, AlF, $Y_2O_3$, or YF, or any combination of two or more thereof.

29. The substrate processing chamber as claimed in claim 1, wherein the number of supply holes are tapered to control a flow direction, or a flow rate, or a combination thereof for the remote plasma species into the process chamber.

30. The substrate processing chamber as claimed in claim 1, wherein a surface of the asymmetrical annular groove is inactive to the remote plasma species.

31. The substrate processing chamber as claimed in claim 30, wherein the inactive surface comprises Teflon, $Al_2O_3$, AN, AlF, $Y_2O_3$, or YF, or any combination of two or more thereof.

32. The substrate processing chamber as claimed in claim 1, wherein a surface on the multiple outlets is inactive to the remote plasma species.

33. The substrate processing chamber as claimed in claim 32, wherein the inactive surface comprises Teflon, $Al_2O_3$, AlN, AlF, $Y_2O_3$, or YF, or any combination of two or more thereof.

34. The substrate processing chamber as claimed in claim 1, further comprising a showerhead assembly coupled to the process chamber and a chamber cleaning gas supply coupled to the showerhead.

35. The substrate processing chamber as claimed in claim 34, wherein the chamber cleaning gas supply supplies a fluorine-containing gas, chlorine-containing gas, oxygen containing-gas, argon, helium, neon, xenon or nitrogen, or any combination of two or more thereof.

36. The substrate processing chamber as claimed in claim 1, wherein the remote plasma source operates in a power range from approximately 1 W to approximately 3000 W.

* * * * *